(12) United States Patent
Hwang

(10) Patent No.: US 7,943,448 B2
(45) Date of Patent: May 17, 2011

(54) SEMICONDUCTOR DEVICE AND METHOD OF MANUFACTURING THE SAME

(75) Inventor: Mun Sub Hwang, Daejeon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 1122 days.

(21) Appl. No.: 11/609,877

(22) Filed: Dec. 12, 2006

(65) Prior Publication Data

US 2007/0131986 A1    Jun. 14, 2007

(30) Foreign Application Priority Data

Dec. 14, 2005 (KR) .................. 10-2005-0123532

(51) Int. Cl.
*H01L 21/336* (2006.01)

(52) U.S. Cl. .............. 438/197; 438/289; 257/E21.433

(58) Field of Classification Search .......... 438/197; 257/E21.433
See application file for complete search history.

(56) References Cited

U.S. PATENT DOCUMENTS

| | | | |
|---|---|---|---|
| 5,856,226 A * | 1/1999 | Wu | 438/291 |
| 6,091,118 A | 7/2000 | Duane | |
| 7,569,444 B2 * | 8/2009 | Ho | 438/197 |
| 2002/0132404 A1 * | 9/2002 | Chen et al. | 438/197 |
| 2002/0137294 A1 * | 9/2002 | Wu et al. | 438/289 |
| 2003/0143791 A1 * | 7/2003 | Cheong et al. | 438/197 |
| 2004/0129959 A1 * | 7/2004 | Kim et al. | 257/288 |
| 2004/0157383 A1 * | 8/2004 | Park | 438/197 |
| 2005/0006675 A1 * | 1/2005 | Tsunashima et al. | 257/288 |
| 2006/0128106 A1 * | 6/2006 | Ho | 438/305 |

* cited by examiner

*Primary Examiner* — Fernando L Toledo
(74) *Attorney, Agent, or Firm* — Sherr & Vaughn, PLLC

(57) ABSTRACT

Embodiments relate to a semiconductor device and a method for manufacturing the same. According to embodiments, a semiconductor device may include an LDD which may include a space having a first width and may be formed in a semiconductor substrate, a channel area which may be formed in the semiconductor substrate within a space having a first width, a gate insulating layer which has a width wider than the first width and may be formed on an upper side of the channel area on the semiconductor substrate, a gate which may be formed with the first width on the gate insulating layer, and a spacer including a first spacer formed at both sides of the gate insulating layer and a second spacer formed at sidewalls of the gate.

3 Claims, 5 Drawing Sheets

SEMICONDUCTOR DEVICE AND METHOD OF MANUFACTURING THE SAME

The present application claims priority under 35 U.S.C. 119 and 35 U.S.C. 365 to Korean Patent Application No. 10-2005-0123532 (filed on Dec. 14, 2005), which is hereby incorporated by reference in its entirety.

BACKGROUND

Embodiments relate to a semiconductor device and a method for manufacturing the same.

A semiconductor device may include a transistor having a source/drain and a gate formed at a device area defined through a LOCOS (local oxidation of silicon) process or an STI (shallow trench isolation) process.

For example, a semiconductor substrate may be formed with isolation layers that may isolate devices. In addition, device areas of the semiconductor substrate may be formed with a gate, for example, including a gate oxide layer and a gate poly. A spacer, for example including an insulting layer, may be formed at sidewalls of the gate poly.

In addition, an lightly doped drain (LDD), into which low-density impurities that may have a conductive type opposite to that implanted into the semiconductor substrate, may be formed in a lower part of the gate oxide layer of the semiconductor substrate. A source/drain, into which high-density impurities that may have a conductive type identical to that implanted into the LDD, may be formed at an area of the semiconductor substrate adjacent to the LDD.

A semiconductor device having the above structure may be scaled down to accommodate the high level of integration and miniaturization of semiconductor devices. However, since many processes may need to be performed to manufacture a semiconductor device having an LDD structure including a small gate width, a production process for a semiconductor device may be degraded.

In addition, overlap capacitance may be created where the LDD overlaps with a gate.

SUMMARY

According to embodiments, a semiconductor device and a method for manufacturing a semiconductor device may reduce overlap capacitance created where a gate overlaps an LDD.

According to embodiments, a semiconductor device and a method for manufacturing a semiconductor device may provide a structure in which a width of a gate may be effectively reduced.

In embodiments, a semiconductor device may include an LDD which may include a space having a first width and may be formed in a semiconductor substrate, a channel area which may be formed in the semiconductor substrate within a space having a first width, a gate insulating layer which may have a width wider than the first width and may be formed on an upper side of the channel area on the semiconductor substrate, a gate which may be formed with the first width on the gate insulating layer, and a spacer including a first spacer formed at both sides of the gate insulating layer and a second spacer formed at sidewalls of the gate.

In embodiments, a method for manufacturing a semiconductor device may include sequentially stacking an oxide layer and a nitride layer on an upper part of a semiconductor substrate, forming an LDD in the semiconductor substrate through an ion implantation process using a first mask layer including a first hole pattern, forming a channel area in a center of the LDD by using a nitride layer which is etched by a width narrower than a width of the first hole pattern, selectively removing the oxide layer of the channel area through an etching process using the etched nitride layer, forming a gate insulating layer in an area where the oxide layer is removed, and forming a gate on the gate insulating layer and the etched nitride layer.

DETAILED DESCRIPTION OF EMBODIMENTS

Figure 1:
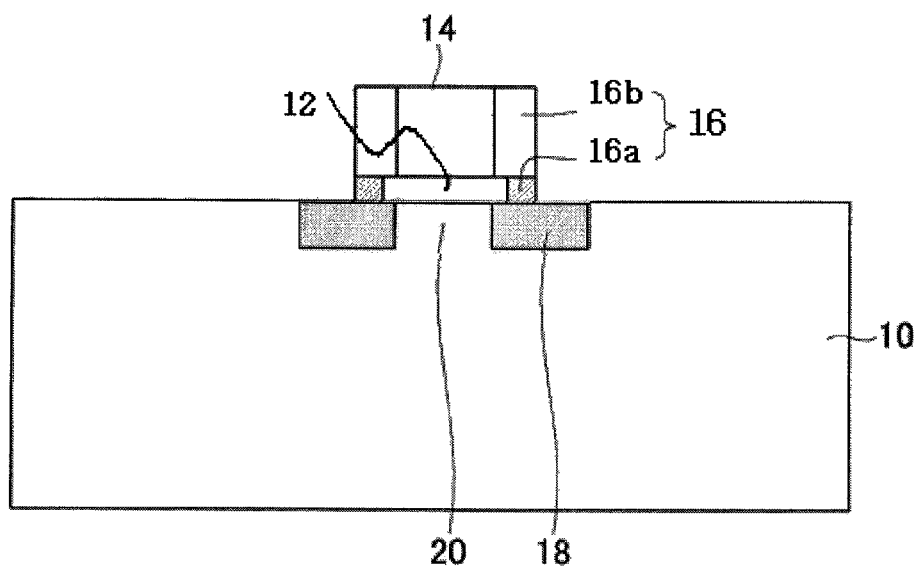
FIG. 1 is an example sectional view illustrating a semiconductor device according to embodiments.

Referring to FIG. 1, a semiconductor device according to embodiments may include LDD 18, which may not overlap with gate 14 in a vertical direction. The semiconductor device according to embodiments may include semiconductor substrate 10.

Gate oxide layer 12, which may be a gate insulating layer, may be formed at an isolation area of semiconductor substrate 10. In addition, gate oxide layer 12 may include a thermal oxide layer.

Gate 14 may be formed on an upper part of gate oxide layer 12, and spacers 16 may be formed at both sides of gate 14 and gate oxide layer 12.

Spacer 16 may include first spacer 16a formed at both sides of gate oxide layer 12 and second spacer 16b formed at a sidewall of gate 14.

A height of an upper surface of second spacer 16b may be identical to a height of the upper surface of gate 14. Hence, a top surface of gate 14 may exist in a same plane as a top surface of second spacer 16b. In addition, an upper surface of second spacer 16b may be flat.

Second spacer 16b may make contact with first spacer 16a and gate oxide layer 12. For example, second spacer 16b may be formed on first spacer 16a and a portion of gate oxide layer 12, according to embodiments.

In addition, second spacer 16b may have a rectangle shape or a substantially rectangular shape. In embodiments, second spacer 16b may have a right-angled shape or a substantially right angle shape. For example, a top and a bottom may be perpendicular to a side, in embodiments.

Gate 14 may include polysilicon, and first spacer 16a may be an oxide layer. In addition, second spacer 16b may include a silicon nitride (SiN) layer.

In addition, LDD 18 may be formed at a lower part of gate oxide layer 12 in semiconductor substrate 10. LDD 18 may be formed around channel area 20. Channel area 20 may have a same width as that of gate 14. Gate oxide layer 12 may be formed wider than channel area 20 and gate 14, which may have identical widths.

In a semiconductor device according to embodiments, LDD 18 may not overlap with the gate. It may therefore be possible to reduce overlap capacitance that may otherwise occur.

In addition, since a width of the gate may be reduced according to embodiments, it may be possible to form a semiconductor device including a gate having a fine line width.

Hereinafter, a method for manufacturing a semiconductor device according to embodiments will be described.

Figure 2:
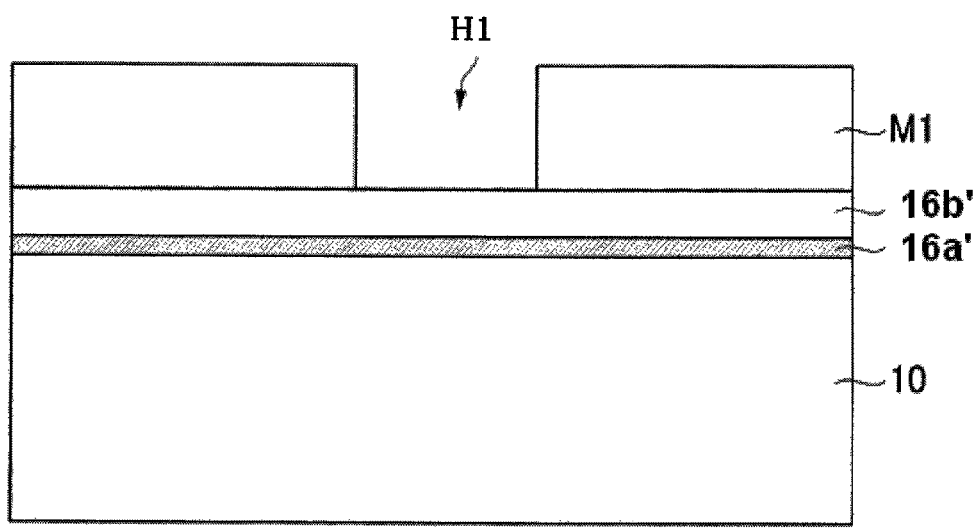
FIGS. 2 to 8 are example sectional views illustrating a method for manufacturing a semiconductor device according to embodiments.

Referring to FIG. 2, oxide layer 16a' and nitride layer 16b' may be sequentially stacked on an upper part of semiconductor substrate 10. Nitride layer 16b' may include a silicon nitride layer.

Next, first mask layer M1 may be formed on an upper part of nitride layer 16b'. First mask layer M1 may be used for an ion implantation process, for example to form LDD 18. In addition, first mask layer M1 may be formed by coating photoresist on an upper part of nitride layer 16b', forming a photoresist layer, and then performing an exposure and development process with respect to the photoresist layer.

First mask layer M1 may be formed through a process that may include first hole pattern H1.

Figure 3:
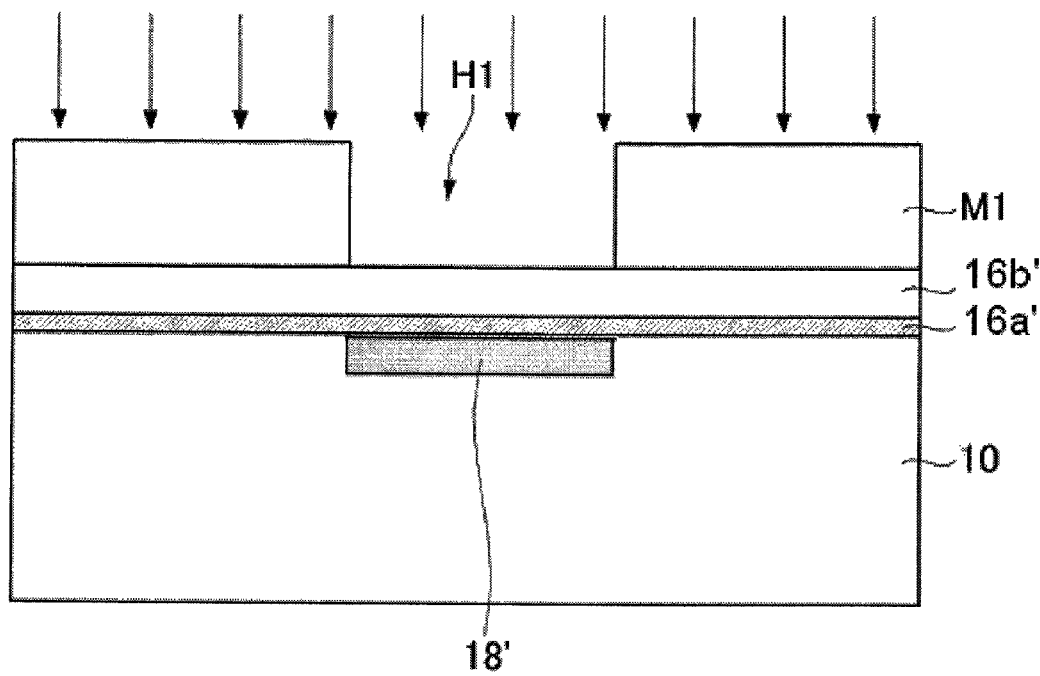

Referring to FIG. 3, an ion implantation process may be performed, for example by using first mask layer M1.

Thus, ions may be implanted into a part of semiconductor substrate 10 in which first hole pattern H1 of first mask layer M1 may be formed, so that an LDD area 18' may be formed in semiconductor substrate 10.

Figure 4:
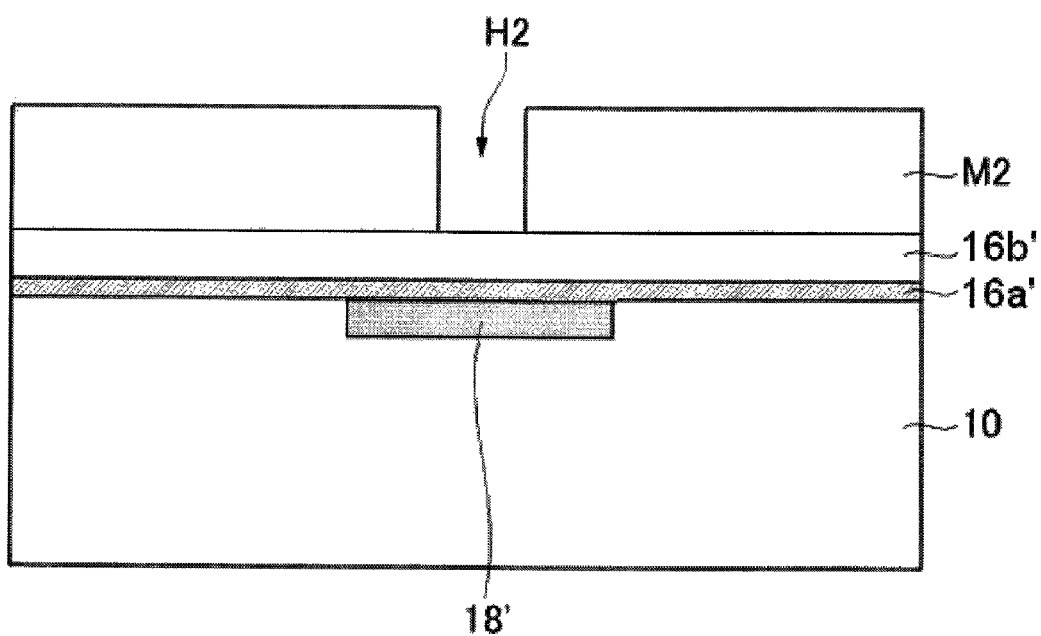

Referring to FIG. 4, first mask layer M1 may be removed, and a second mask layer M2 may be formed on an upper part of nitride layer 16b'.

Mask layer M2 may include second hole pattern H2 for forming channel area 20 while defining a width of gate 14, and second hole pattern H2 may be formed narrower than first hole pattern H1.

Figure 5:
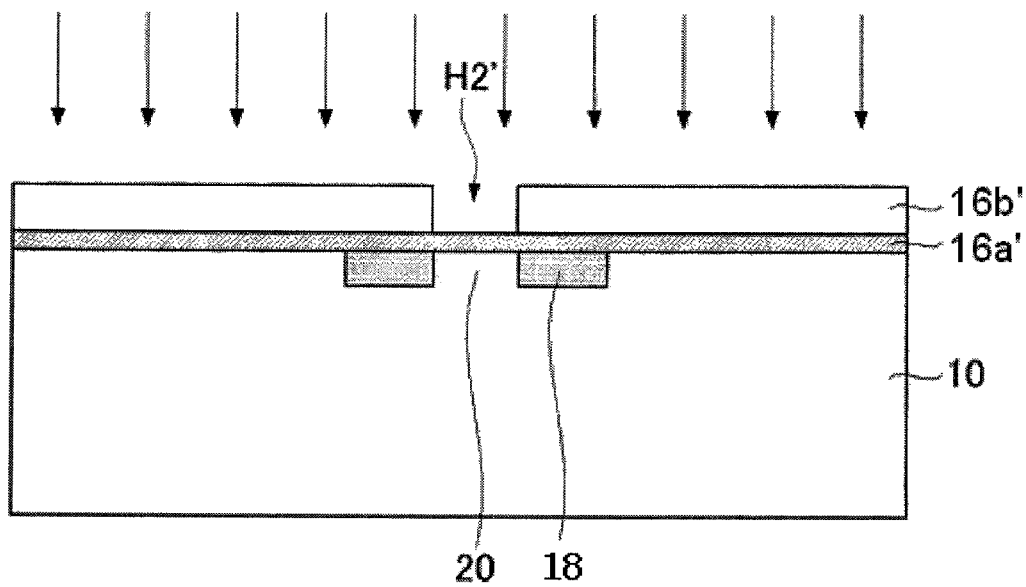

Referring to FIG. 5, an etching process may be performed, for example by using second mask layer M2, and nitride layer 16b' may thereby be selectively etched. Then, second mask layer M2 may be removed.

Through the etching process using second mask layer M2, a space where gate 14 may be formed later may be created in nitride layer 16b', for example in the form of hole pattern H2'.

Subsequently, an ion implantation process may be performed, for example by using nitride layer 16b' which may have been selectively etched.

Ions, for example having a conductive type opposite to that of ions that may have been implanted when the LDD area 18' was formed, may be implanted during the ion implantation process.

Thus, channel area 20 may be formed in semiconductor substrate 10, and LDD 18 may be formed in the vicinity of channel area 20.

Figure 6:
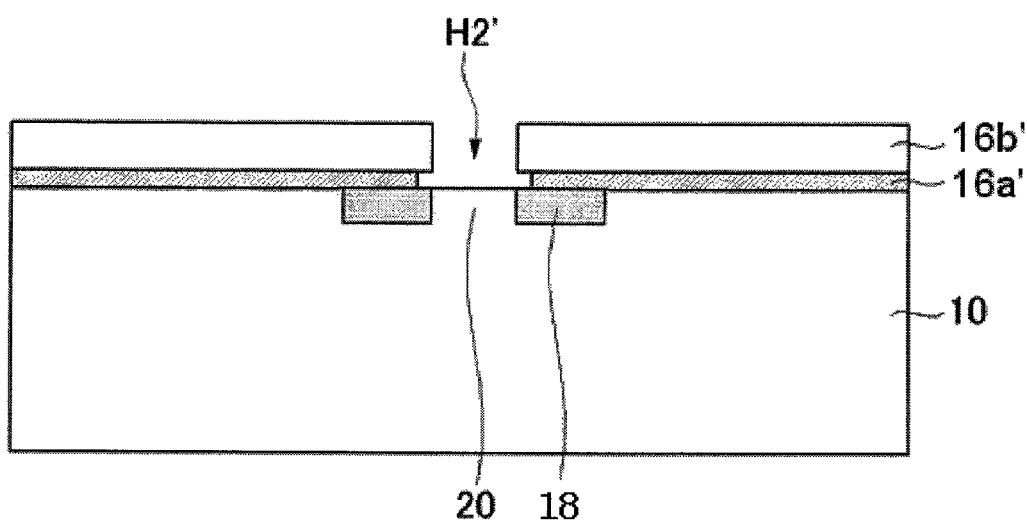

Referring to FIG. 6, an etching process may be performed, for example by using the selectively etched nitride layer 16b', and may thereby selectively remove oxide layer 16a'.

A part of oxide layer 16a' may be removed, for example through a wet etching process. The removed part of oxide layer 16a' may have a width wider than hole pattern H2' of the selectively etched nitride layer 16b'.

Figure 7:
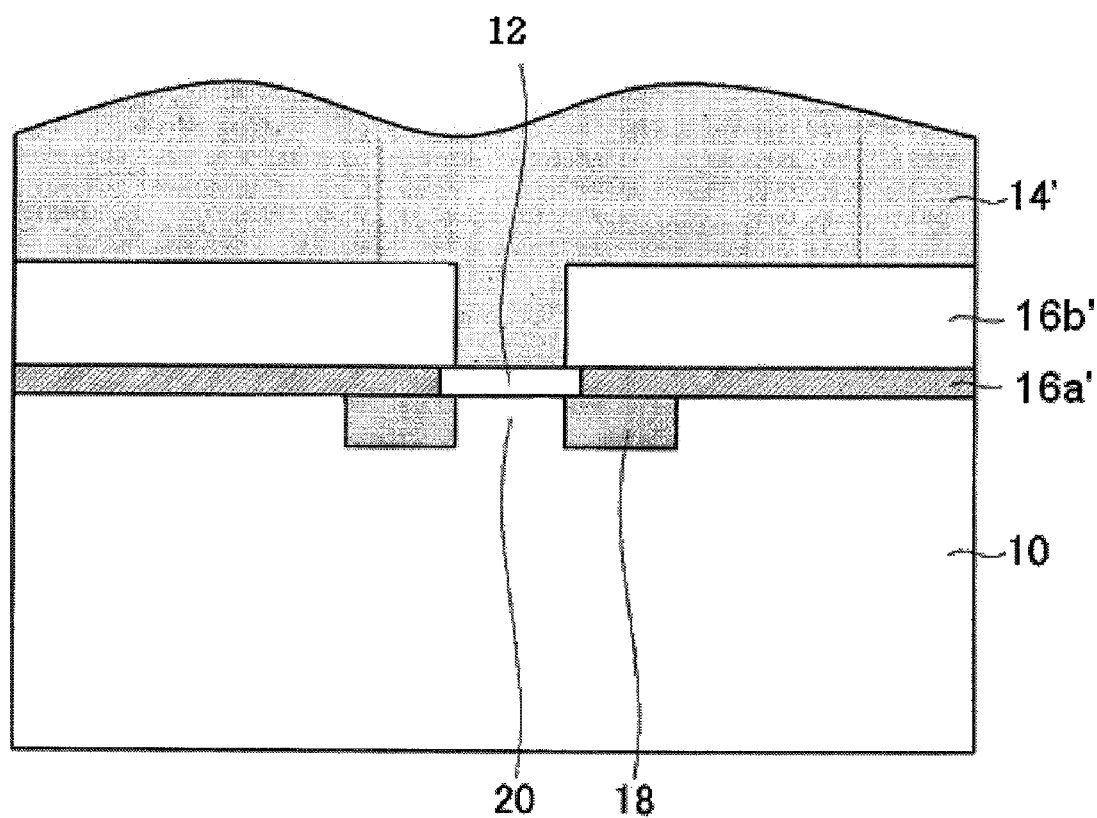

Referring to FIG. 7, gate oxide layer 12, which may include a thermal oxide layer, may be formed in a part where the oxide layer 16a' has been removed, for example through a thermal oxidation process.

Thereafter, polysilicon may be deposited on the resultant structure, and may thereby form conductive layer 14' with which the hole pattern H2' is gap filled. A planarization process, such as a chemical mechanical polishing process, may be performed, for example by using the nitride layer 16a as a stop layer, thereby planarizing the conductive layer 14'.

Figure 8:
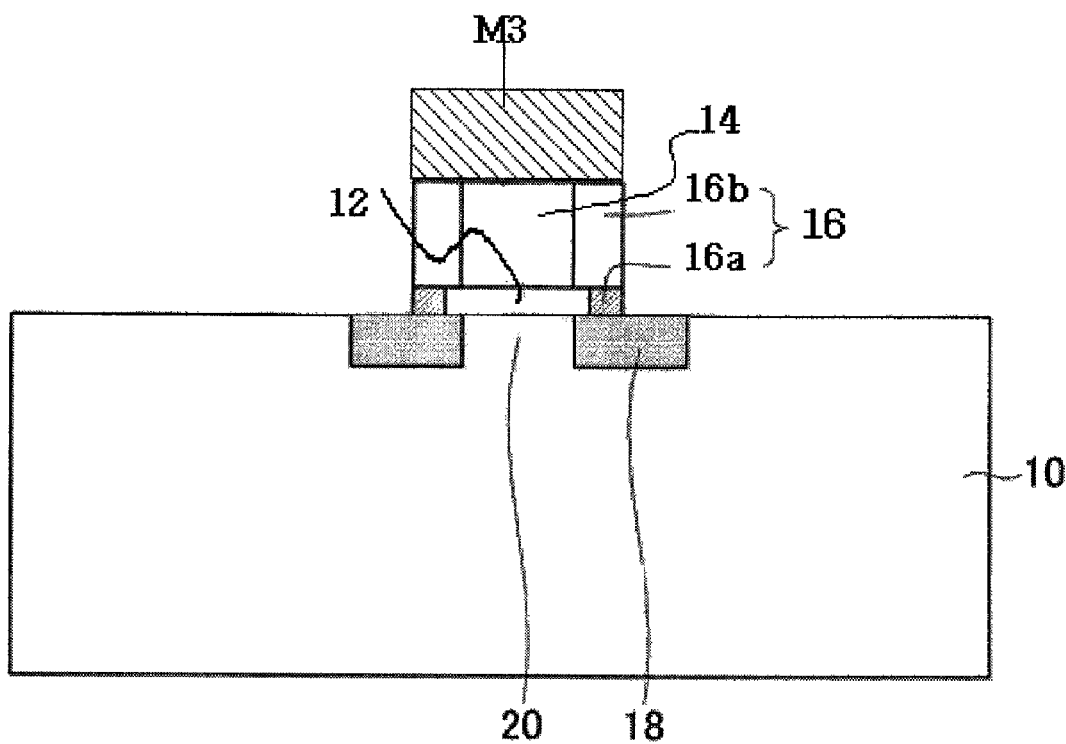

Referring to FIG. 8, gate 14 may be formed in hole pattern H2' of nitride layer 16b'.

Third mask layer M3 may then be formed on an upper part of gate 14 and nitride layer 16b', which may have been selectively etched.

Third mask layer M3 may be used to form spacers 16 at the sidewalls of gate 14. According to embodiments, third mask layer M3 may be formed narrower than first hole pattern H1 of first mask layer M1 and wider than second hole pattern H2 of second mask layer M2.

Nitride layer 16b', which may have been selectively etched, and oxide layer 16a' may be etched, for example by using third mask layer M3, and may then be removed. In embodiments, this process may be used to fabricate a semiconductor device having the structure illustrated in FIG. 1.

According to embodiments, an LDD area may be formed through an ion implantation process using a first mask layer, and a channel area may be formed through the ion implantation process using the second mask layer. In embodiments, in the ion implantation process for forming the channel area, ions, which have conductive types opposite to those of ions implanted when the LDD area may be formed, may be implanted.

In addition, after forming a hole pattern identical to a second hole pattern of the second mask layer in a nitride layer, a gate may be formed in the hole pattern.

According to embodiments, since the LDD may not overlap the gate, overlap capacitance created in related art semiconductor devices may be reduced, and a gate width may be reduced. Accordingly, it may be possible to manufacture a gate having a fine line width.

According to embodiments, a number of steps required to manufacture a device may be reduced. Accordingly it may be possible to improve production capacity for a device.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
    sequentially forming an oxide layer and a nitride layer on an upper part of a semiconductor substrate;
    forming a lightly doped drain (LDD) in the semiconductor substrate through an ion implantation process using a first mask layer having a first hole pattern;
    forming a channel area in a center of the LDD having a width narrower than the first hole pattern using the nitride layer which is etched to remove the width narrower than a width of the first hole pattern;
    selectively removing the oxide layer of the channel area through an etching process using the etched nitride layer;
    forming a gate insulating layer in an area where the oxide layer was removed; and
    forming a gate over the gate insulating layer and within the etched nitride layer,
    wherein forming the channel area in the center of the LDD comprises:
    forming a second mask layer having a second hole pattern on an upper part of the nitride layer, the second hole pattern having a width narrower than the width of the first hole pattern;
    removing the second mask layer after selectively etching the nitride layer using the second mask layer; and
    implanting ions having a conductive type opposite of a conductive type of ions used to form the LDD using the etched nitride layer as a mask.

2. The method of claim 1, further comprising forming a spacer using a third mask having a width narrower than the width of the first hole pattern and wider than the width of the second hole pattern.

3. The method of claim 2, wherein forming the spacer comprises:
    gap-filling the gate insulating layer and the etched nitride layer with a conductive layer to form the gate;
    forming a gap-filled gate on the gate insulating layer and the etched nitride layer by planarizing the conductive layer;
    forming the third mask layer, having the width narrower than the width of the first hole pattern and wider than the width of the second hole pattern;
    selectively etching the nitride layer and the oxide layer through an etching process using the third mask layer; and
    removing the third mask layer.

* * * * *